United States Patent
Nagata et al.

[11] Patent Number: 5,838,549
[45] Date of Patent: Nov. 17, 1998

[54] MEMORY MODULE AND AN IC CARD

[75] Inventors: Tatsuya Nagata, Ishioka; Hiroya Shimizu, Toride; Atsushi Nakamura, Fuchu; Hideshi Fukumoto, Hitachinaka; Toshio Sugano, Kodaira, all of Japan

[73] Assignee: Hitachi, Ltd., Tokyo, Japan

[21] Appl. No.: 788,423

[22] Filed: Jan. 27, 1997

[30] Foreign Application Priority Data

Jan. 25, 1996 [JP] Japan ..................................... 8-010717

[51] Int. Cl.$^6$ ................................ H05K 1/11; H01R 9/09
[52] U.S. Cl. ...................... 361/794; 174/35 R; 361/777; 439/941
[58] Field of Search ..................................... 174/250, 253, 174/255, 260, 261, 35 R, 35 C; 257/700, 723, 724, 728, 905; 364/708.1; 333/246, 247, 260; 361/760, 772, 774, 777, 780, 783, 792, 795, 818; 439/68, 70, 71, 59, 62, 65, 95, 108, 677, 941, 947, 951

[56] References Cited

FOREIGN PATENT DOCUMENTS 5-36923   2/1993   Japan .

*Primary Examiner*—Donald Sparks
*Attorney, Agent, or Firm*—Antonelli, Terry, Stout & Kraus, LLP

[57] ABSTRACT

In semiconductor modules having a plurality of semiconductor devices mounted on a multilayer printed circuit boards as the processing speed increases, a short circuit current flowing through CMOS devices in the semiconductor devices during operation can cause noise because of ground inductance or power supply inductance. This noise can result in erroneous operations. To solve this problem, the power supply layer or grand layer that is connected to either the power supply terminal Vcc or the ground terminal Gnd of each semiconductor memory, which is located farther from the connection terminals, is arranged closer to the semiconductor memories with this arrangement, the short circuit current flowing through the semiconductor memories is more strongly magnetically coupled with the power supply layer or ground layer arranged close to them. Thus, it is possible to reduce the effective inductance. This, in turn, reduces noise, making it possible to provide a semiconductor module with an increased processing speed.

10 Claims, 6 Drawing Sheets

MEMORY MODULE AND AN IC CARD

BACKGROUND OF THE INVENTION

The present invention relates to a semiconductor module, such as a memory module and an IC card, in which a plurality of semiconductor devices such as semiconductor memories are mounted on a printed circuit board.

Conventional semiconductor modules, such as memory modules, have a configuration and structure in which, as described in Japan Patent Laid-Open No. 36923/1993, power supply lines and ground lines are arranged in parallel on the semiconductor memory-mounting printed circuit board to prevent noise-induced undesired operation. This arrangement, however, focuses only on the connection between the semiconductor memories and the power supply layers and ground layers on the printed circuit board, but does not consider the relative arrangement between the semiconductor memories and the printed circuit board or the arrangement of the ground layers and power supply layers.

There are growing demands on electronic apparatus such as computers for faster processing speeds. To meet these demands, semiconductor modules need to be able to perform high-speed, large-capacity processing.

When such a semiconductor module is operated at high speed, a large current flows temporarily causing noise because of inductance present in current paths in the semiconductor devices and the printed circuit board. This noise, in turn, causes erroneous operation of the semiconductor module itself and false operation in electronic apparatus connected to the semiconductor module. Thus, reduction in noise has become an important problem.

This problem has not been serious in the past because the processing speed of the conventional semiconductor modules such as memory modules is about 12–50 MHz in clock speed. The problem becomes important, however when the clock speed is around 50–100 MHz, and becomes unavoidable at 100 MHz or higher.

Figure 2:
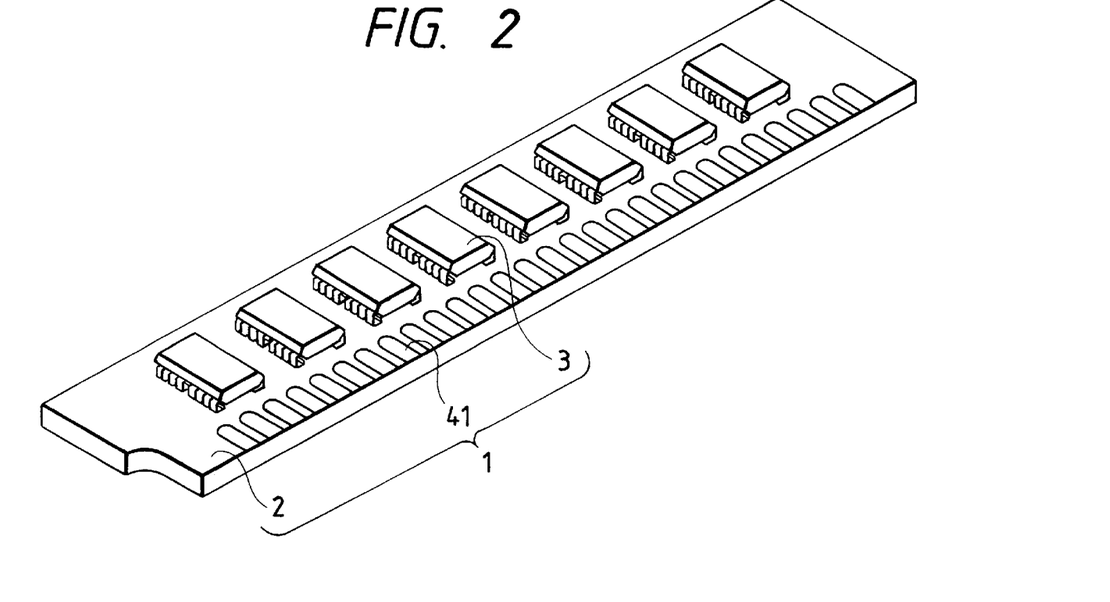
FIG. 2 is a perspective view of the memory module of the embodiment.

The noise of the semiconductor module will be explained below, taking the case of a memory module. As shown in FIG. 2, a memory module 1 used in an ordinary electronic apparatus includes semiconductor memories 3 mounted on a multilayer printed circuit board 2 and connection terminals 41 formed at one side edge of the printed circuit board 2. To realize high reliability, low cost and large capacity, the memory module has its inherent restrictions and problems.

That is, to realize a large capacity, a plurality of semiconductor memories are mounted on a printed circuit board. In selecting addresses of the semiconductor memories on the printed circuit board, a plurality of address buffers of the memories are switched at a time, and a short circuit current flows. This short circuit current is one major cause of noise.

Figure 3:
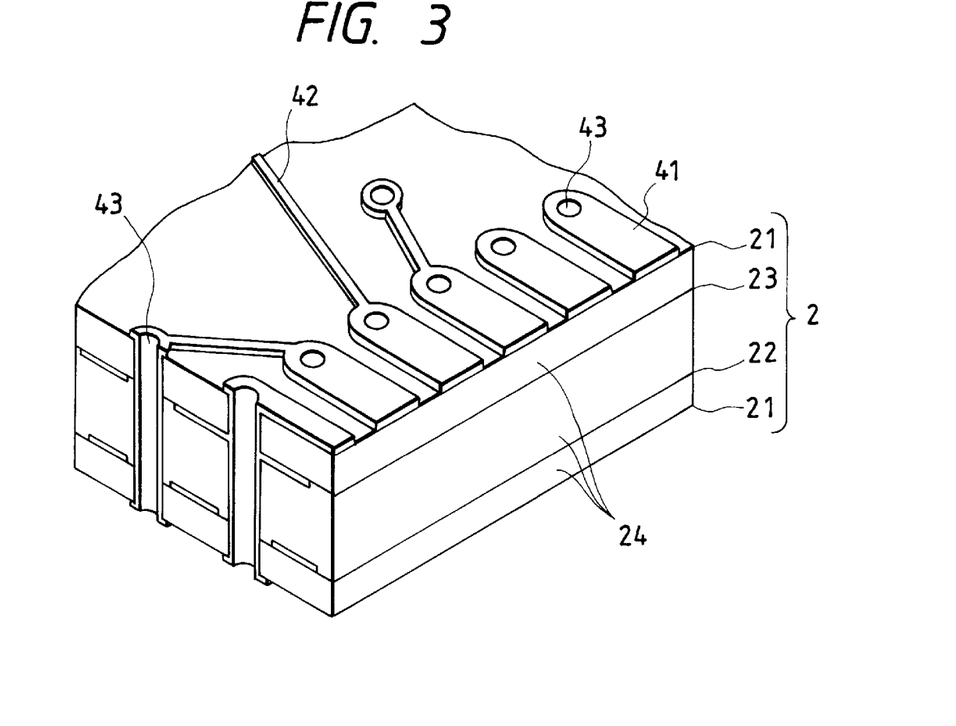
FIG. 3 is a detailed, partial perspective view of the printed circuit board of FIG. 1.

The memory module also requires many interconnections for connecting the plurality of semiconductor memories and the connection terminals. Increasing the number of interconnection layers raises the cost. Hence, to eliminate this drawback, when the printed circuit board has four metal conductive layers, two signal layers 21, a power supply layer 22 and a ground layer 23, as shown in FIG. 3, areas are provided in some cases in a part of the power supply layer and ground layer 23 to accommodate interconnections 42 and to connect them with signal lines.

This arrangement, although it reduces the total number of layers and is thus economically advantageous, is more likely to produce noise because the area of the power supply layer 22 and ground layer 23 is reduced.

Figure 4:
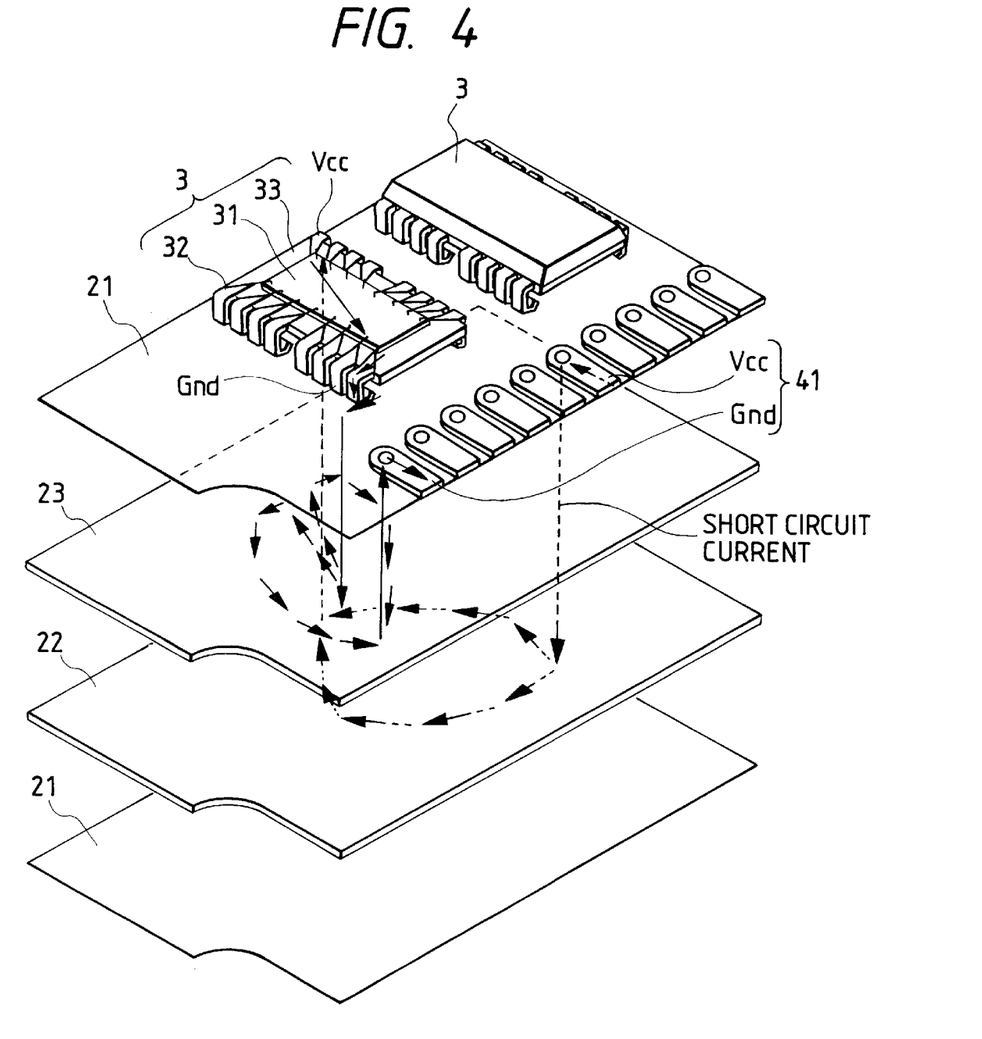
FIG. 4 is a partial exploded perspective view of the memory module of the embodiment.

To realize a memory module with high reliability against adverse environmental effects, it is advantageous to use a semiconductor memory 3 whose chip 31 is encapsulated with a sealing material 33 such as resin, as shown in FIG. 4. However, as the memory capacity increases, the size of the semiconductor chip 31 also increases, which in turn tends to increase the inductance of the interconnection and leads 32 on the chip 31.

The short circuit current caused during address switching passes from the connection terminal 41 through the power supply layer 22 to the semiconductor memory 3, from which it further flows to the ground layer and then to the connection terminal 41. When a semiconductor package is mounted on a printed circuit board, the current flowing into the semiconductor memory 3 flows along a path 2 mm apart from the printed circuit board because of the thickness of the semiconductor memory 3 and the height of the leads 32, thus increasing the inductance.

Further, in an arrangement where the power supply of the semiconductor memory 3 is located remote from the connection terminal 41 and the ground layer is arranged next to the signal layer 21 on which the semiconductor memory 3 is mounted, the currents flowing through the semiconductor memories 3 have been found to generate an undesirable induced current in the ground layer of the printed circuit board.

The memory module of this type therefore has a serious drawback of a large inductance although the distance between the ground of the semiconductor memory 3 and the ground of the connection terminal 41 is small. As the inductance of the ground increases, noise becomes large, making high-speed processing difficult.

An object of this invention is to provide a semiconductor module and a memory module, which enable high-speed processing by reducing the inductance of the power supply and ground, thereby reducing noise.

SUMMARY OF THE INVENTION

To achieve the above and other objects, the semiconductor module of this invention comprises: a multilayer printed circuit board having a plurality of metal conductive layers and a plurality of insulating layers interposed between the metal conductive layers; a plurality of semiconductor devices mounted on at least one side of the multilayer printed circuit board and electrically connected to the multilayer printed circuit board; and a plurality of connection terminals arranged at one edge of at least one side of the multilayer printed wiring board to electrically connect the printed circuit board to external circuits; wherein the plurality of metal conductive layers include a signal layer having the plurality of semiconductor devices mounted thereon and the plurality of connection terminals formed thereon, a power supply layer for electrically connecting the power supply terminal of each of the semiconductor devices with the power supply terminal of the connection terminals, and a ground layer for electrically connecting the ground terminal of each of the semiconductor devices with a ground terminal of the connection terminals; wherein when the power supply terminal of each of the semiconductor devices is located farther from the connection terminals than the ground terminal, the power supply layer is arranged closer to the semiconductor devices than the ground layer, and when the ground terminal of each of the semiconductor devices is located farther from the connection terminals than the power supply terminal, the ground layer is arranged closer to the semiconductor devices than the power supply layer.

Another feature of this invention is that the memory module comprises: a multilayer printed circuit board having a plurality of metal conductive layers and a plurality of insulating layers interposed between the metal conductive layers; a plurality of semiconductor memories mounted on at least one side of the multilayer printed circuit board and electrically connected to the multilayer printed circuit board; and a plurality of connection terminals arranged at one edge of at least one side of the multilayer printed circuit board to electrically connect the printed circuit board to external circuits; wherein the plurality of metal conductive layers include a signal layer having the plurality of semiconductor memories mounted thereon and the plurality of connection terminals formed thereon, a power supply layer for electrically connecting the power supply terminal of each of the semiconductor memories with the power supply terminal of the connection terminals, and a ground layer for electrically connecting the ground terminal of each of the semiconductor memories with the ground terminal of the connection terminals; wherein when the power supply terminal of each of the semiconductor memories is located farther from the connection terminals than the ground terminal, the power supply layer is arranged closer to the semiconductor memories than the ground layer, and when the ground terminal of each of the semiconductor memories is located farther from the connection terminals than the power supply terminal, the ground layer is arranged closer to the semiconductor memories than the power supply layer.

A further feature of this invention is that the memory module comprises: a multilayer printed circuit board having a plurality of metal conductive layers and a plurality of insulating layers interposed between the metal conductive layers; a plurality of semiconductor memories mounted on at least one side of the multilayer printed circuit board and electrically connected to the multilayer printed circuit board; and a plurality of connection terminals arranged at one edge of at least one side of the multilayer printed circuit board to electrically connect the printed circuit board to external circuits; wherein the plurality of metal conductive layers include at least one first signal layer having the plurality of semiconductor memories mounted thereon and the plurality of connection terminals formed thereon, at least one power supply layer for electrically connecting the power supply terminal of each of the semiconductor memories with the power supply terminal of the connection terminals, at least one ground layer for electrically connecting the ground terminal of each of the semiconductor memories with the ground terminal of the connection terminals, and at least one second signal layer for electrically connecting the signal terminals of each of the semiconductor memories with the signal terminals of the connection terminals; wherein a first insulating layer is interposed between the first signal layer and the power supply layer or the ground layer, a second insulating layer is arranged adjacent to the power supply layer or the ground layer and interposed between the power supply layer and the ground layer, and the thickness of the second insulating layer is ¼ to ½ the thickness of the first insulating layer.

A further feature of this invention is that the IC card comprises: a multilayer printed circuit board having a plurality of metal conductive layers and a plurality of insulating layers interposed between the metal conductive layers; a plurality of semiconductor memories mounted on at least one side of the multilayer printed circuit board and electrically connected to the multilayer printed circuit board; and a plurality of connection terminals arranged at one edge of at least one side of the multilayer printed circuit board to electrically connect the printed circuit board to external circuits;

wherein the plurality of metal conductive layers include a signal layer having the plurality of semiconductor memories mounted thereon and the plurality of connection terminals formed thereon, a power supply layer for electrically connecting the power supply terminal of each of the semiconductor memories with the power supply terminal of the connection terminals, and a ground layer for electrically connecting the ground terminal of each of the semiconductor memories with the ground terminal of the connection terminals; wherein when the power supply terminal of each of the semiconductor memories is located farther from the connection terminals than the ground terminal, the power supply layer is arranged closer to the semiconductor memories than the ground layer, and when the ground terminal of each of the semiconductor memories is located farther from the connection terminals than the power supply terminal, the ground layer is arranged closer to the semiconductor memories than the power supply layer.

In a multilayer printed circuit board having a plurality of metal conductive layers and a plurality of insulating layers interposed between the metal conductive layers, according to this invention, the signal layer of the metal conductive layers has a plurality of semiconductor devices mounted thereon and a plurality of connection terminals formed thereon. The power supply layer electrically connects a power supply terminal of each semiconductor device to a power supply terminal of the connection terminals. The ground layer electrically connects a ground terminal of each semiconductor device to a ground terminal of the connection terminals. When the power supply terminal of the semiconductor device is located farther from the connection terminals than the ground terminal, the power supply layer is arranged closer to the semiconductor devices. When the ground terminal of the semiconductor device is located farther from the connection terminals than the power supply terminal, the ground layer is arranged closer to the semiconductor devices.

Of the plurality of insulating layers, a second insulating layer interposed between the power supply layer and the ground layer has a thickness which is ¼ to ½ the thickness of a first insulating layer interposed between the signal layer and the power supply layer or the ground layer.

This arrangement reduces the power supply inductance and ground inductance of the semiconductor modules, such as memory modules and IC cards, thereby reducing noise and increasing the processing speeds of the modules.

DETAILED DESCRIPTION OF PREFERRED EMBODIMENTS

A semiconductor module of this invention will be described with reference to the accompanying drawings by taking a memory module 1 as an example of the semiconductor module.

The memory module 1 of an example of a semiconductor module of this invention will be explained referring to FIGS. 1, 2 and 4.

Figure 1:
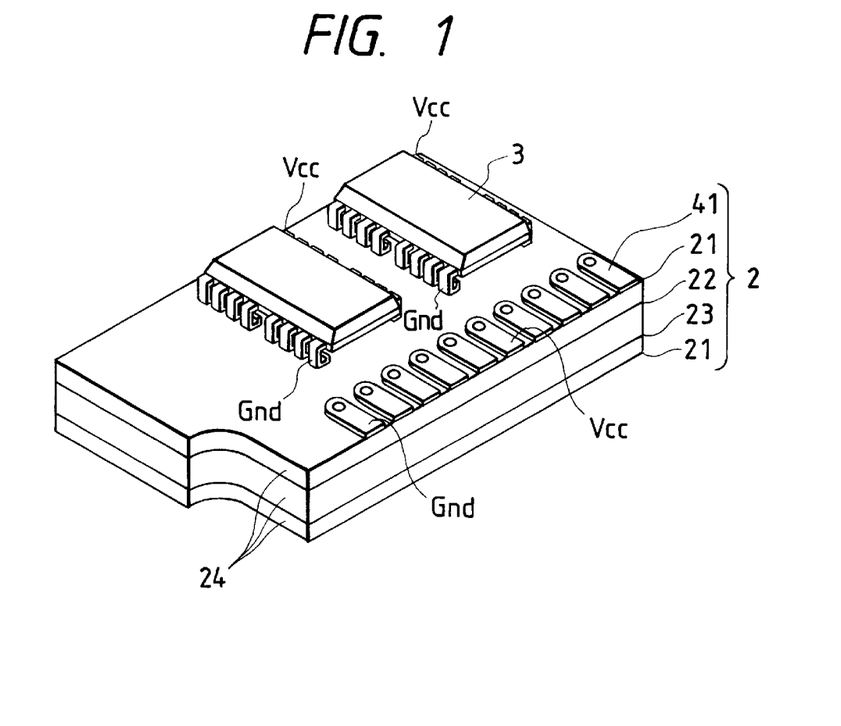
FIG. 1 is a partial perspective view of a memory module of one embodiment of this invention.

As shown in FIG. 1 and 2, the memory module 1 of this embodiment includes a multilayer printed circuit board 2 comprising a plurality of metal conductive layers and a plurality of insulating layers interposed between the metal conductive layers; a plurality of semiconductor memories 3 mounted on the-printed circuit board 2; and connection terminals 41 at one edge of the printed circuit board 2 to provide electrical connection with the outside.

In this embodiment, an example where two or more semiconductor memories 3 are arranged on one side of the printed circuit board 2 will be explained. Later, another embodiment will be explained, in which the semiconductor memories are arranged on both sides.

First, let us explain a case in which the semiconductor memories are mounted on only one side of the board. As shown in FIG. 1, the metal conductive layers comprise a signal layer 21, a power supply layer 22 and a ground layer, which are formed in a multilayer manner in the following order, from the top to the bottom: the signal layer 21 on which the semiconductor memories 3 are mounted; the power supply layer 22 which is connected with a power supply Vcc of the semiconductor memory 3 located farther than a ground Gnd of the memory 3 from the connection terminals 41 arranged at one edge of the printed circuit board; and the ground layer 23 arranged below the power supply layer 22, i.e., arranged farther in the direction of thickness from the semiconductor memories 3 than the power supply layer 22. These metal conductive layers are isolated from one another by insulating layers 24.

The semiconductor memory 3, as shown in FIG. 4, has a structure in which the chip 31 and a part of the leads 32 electrically connected to the chip 31 are encapsulated with the sealing material 33. The semiconductor memory 3 also has signal terminals for address, data and control, a power supply terminal and a ground terminal.

The metal conductive layers are ordinarily made of a copper foil but may be made of other metals, preferably with low resistivity. The insulating layers 24 are preferably made of epoxy containing glass woven fabric but may also be made of a resin material such as polyamide which has a high insulating performance and which can be readily laminated.

The metal conductive layers are preferably 3–100 $\mu$m thick. Because the resistance loss increases as the thickness decreases and because the pattern formation becomes difficult as the thickness increases, it is particularly preferable to set the thickness in the range of 10–40 $\mu$m.

The thickness of the insulation layer is determined considering the ease of manufacture, the module's mechanical strength, mechanical rigidity and electrical insulation and the dielectric constant of the interconnection, and therefore depends on the material used. The thickness of the insulation layer that can be in the range of 3 $\mu$m to 1 mm.

Now, the operation of this embodiment will be explained. The semiconductor memory 3 has a function of storing and reproducing digital data in response to external signals supplied from the connection terminals 41. The Vcc terminal of the semiconductor memory 3 is connected to the power supply, and the Gnd terminal of the memory 3 is connected to the ground to supply current to the chip.

The terminals of the semiconductor memory 3 connect through signal interconnects, power supply layer 22 and ground layer 23 to the connection terminals 41, which are further connected to signals of external circuits, such as the printed circuit boards of a computer, and to power supplies.

The semiconductor memory 3 connected to external circuits in this way performs storage and reproduction of digital data according to control from external circuits. Ordinary, the signals include address, address strobe, data, read/write and output enable signals, and specify an address for storage and reproduction of data.

Figure 7:
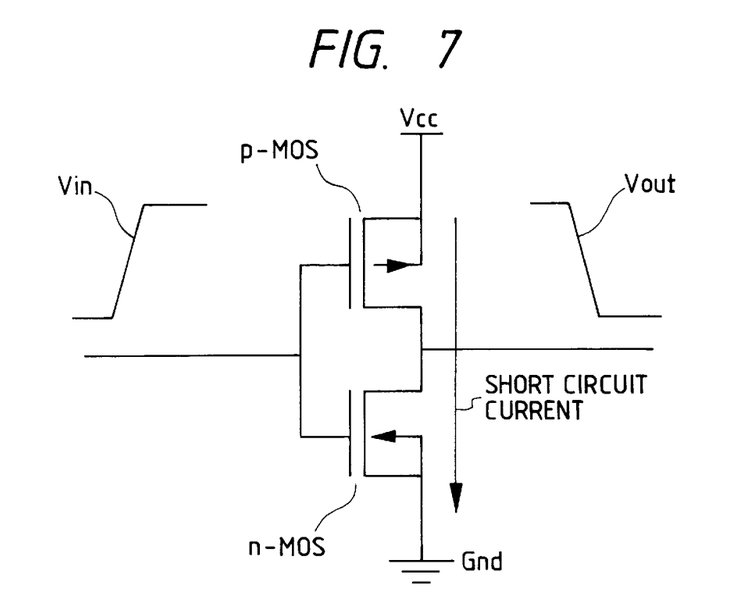
FIG. 7 is a schematic diagram for explaining the short circuit current.

During storage or reproduction operations, a large current passes through the memory module 1 temporarily at the timing when the voltages of a plurality of addresses and data simultaneously change from high to low level or from low to high level. Particularly, in a CMOS (complementary metal oxide semiconductor) circuit as shown in FIG. 7, when the output signal Vout is inverted by the logic inversion of the input signal yin, both the p-channel MOS (p-MOS) and the n-channel MOS (n-MOS) become conductive instantaneously, allowing a short circuit current to flow from the power supply Vcc to the ground Gnd.

In the memory module 1 of this embodiment, the short circuit current flows in from the Vcc terminal of the connection terminals 41 through the via 43, power supply layer 22 and via 43 and through the power supply terminal Jcc of the semiconductor memory 3 into the semiconductor memory 3. The current then flows out from the ground terminal Gnd of the semiconductor memory 3 through the via 43, ground layer 23 and via 43 to the Gnd terminal of the connection terminals 41.

In this embodiment, because the semiconductor memory 3 is so arranged that the power supply terminal Vcc is located farther from the connection terminals 41 than its ground terminal Gnd and the power supply layer 22 is closer to the semiconductor memory 3 than the ground layer 23, the magnetic coupling between the current flowing through the power supply layer 22 and the current flowing through the semiconductor memory 3 is large, causing a current induced in the ground layer 23 by the current flowing through the power supply layer 22 to flow toward the connection terminals 41. This makes it possible to reduce the ground inductance and the power supply inductance from the semiconductor memory 3 to the connection terminals 41. This, in turn, reduces noise and provides a memory module 1 with faster processing speed.

In this embodiment, because the power supply terminal Vcc of the semiconductor memory 3 is arranged farther from the connection terminals 41 than the ground terminal Gnd, the power supply layer 22 is closer to the semiconductor memory 3 than the ground layer 23. A similar effect can be obtained in the opposite case. That is, when the ground terminal Gnd of the semiconductor memory 3 is farther from the connection terminals 41 than the power supply terminal Vcc, the ground layer 23 should be located closer to the semiconductor memory 3 than the power supply layer 22.

Although an SOJ package is used for the semiconductor memory 3 of this embodiment, a similar effect can be produced even when another package is used in which the power supply terminal and ground terminal of he semiconductor memory are provided unevenly in some areas.

In this embodiment, the plurality of metal conductive layers comprise a signal layer having a plurality of semiconductor devices mounted thereon and a plurality of connection terminals formed thereon, a power supply layer for electrically interconnecting the power supply terminal of the semiconductor memory with the power supply terminal of the connection terminals, and a ground layer for electrically interconnecting the ground terminal of the semiconductor memory with the ground terminal of the connection terminals; and the layer, connected to the terminal, out of the power supply terminal and the ground terminal of the semiconductor memory, which is arranged farther from the connection terminals is closer to the semiconductor memory. This configuration reduces the ground inductance and power supply inductance present in the area from the semiconductor memory to the connection terminals, minimizing noise and making it possible to provide a memory module with faster processing speeds.

Next, another embodiment will be explained, to which the same principle as the first embodiment is applied, and which has the semiconductor memories 3 of the previous embodiment arranged on both sides of the printed circuit board 2. Explanations of those configurations and operations that are similar to those of the first embodiment will be omitted.

Referring to FIG. 1, the printed circuit board 2 has four metal conductive layers, which are, from the top to the bottom, a signal layer 21, a power supply layer 22, a ground layer 23 and a signal layer 21. The semiconductor memories 3 mounted on the top signal layer 21 are so arranged such that their power supply terminals Vcc are farther from the connection terminals 41 than the ground terminals Gnd, and the power supply layer 22 of the printed circuit board 2 is arranged closer to the semiconductor memories 3 mounted on the top signal layer 21 than the other layers. This arrangement is the same as the first embodiment.

On the other hand, in accordance with a modification of first embodiment additional semiconductor memories 3 can be mounted on the surface of the bottom signal layer 21 of FIG. 1, which cannot be seen, in the same way that the illustrated memories 3 are mounted on the top signal layer 21. The semiconductor memories 3 at the back surface are close to the ground layer 23 of the printed circuit board 2, so that their ground terminals Gnd are farther from the connection terminals 41 than the power supply terminals Vcc in order to implement the present invention.

The operation and effect of this embodiment are identical with those of the first embodiment. In this embodiment, the printed circuit board has four metal conductive layers which are, from the top to the bottom, a signal layer, a power supply layer, a ground layer and a signal layer. The semiconductor memories on the top signal layer are so oriented that the power supply terminal of each semiconductor memory is farther from the connection terminals than the ground terminals. On the other hand the semiconductor memories on the bottom signal layer are so oriented that the ground terminals are farther from the connection terminals than the power supply terminals. This arrangement reduces the ground inductance and power supply inductance present in the area from the semiconductor memory to the connection terminal and therefore minimizes noise, increasing the processing speeds of the memory module 1.

In the above two embodiments, the semiconductor memories 3 use an SOJ semiconductor package, whose inner chip is mounted face-up, and the surface of the chip 31 on which a circuit pattern is formed is up, as shown in FIG. 4. Because the signals, power supply and ground are led out from the terminal pads on the chip 31 through the leads 32, the leads 32 of the semiconductor memories 3 are remote from the power supply layer 22 or ground layer 23 because of the thickness of the chip 31 and the encapsulating material 33, tending to increase the power and ground inductance.

Figure 8:
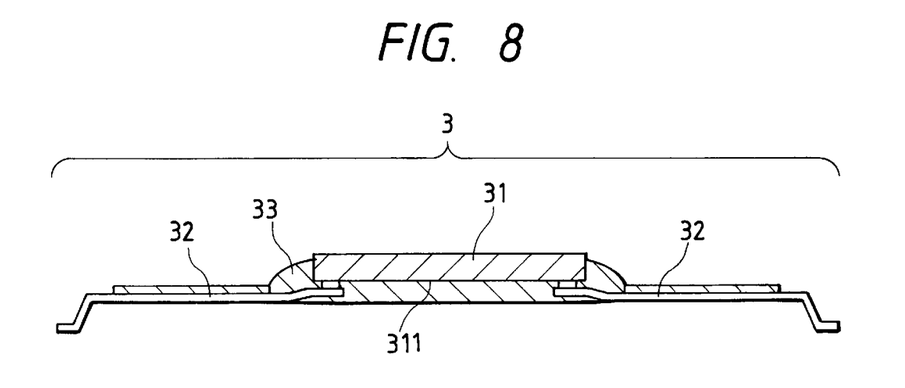
FIG. 8 is a cross section of a face-down semiconductor memory.

If a face-down semiconductor memory 3 whose pattern surface 311 provided with circuits of the chip 31 is face-down, as shown in FIG. 8, is mounted on the printed circuit board 2 of FIG. 1, the distances between the leads 32 and the power supply layer 22 and ground layer 23 can be reduced, minimizing the ground and power supply inductance present in the area from the semiconductor memory 3 to the connection terminals 41. This reduces noise and increases the processing speed of the memory module 1.

Next, another embodiment of the memory module 1 according to this invention will be described referring to FIGS. 5 and 1.

This embodiment has the semiconductor memories 3 mounted and electrically connected to both sides of a printed circuit board 2 that has six metal conductive layers. The printed circuit board 2 has, from the top to the bottom, a signal layer 21a, a first insulating layer 241, an upper power supply layer 22, a second insulating layer 242, a ground layer 23, a third insulating layer 243, a signal layer 21b, a first insulating layer 241, a lower power supply layer 22, a first insulating layer 241 and a signal layer 21a.

As in the previous embodiment explained with reference to FIGS. 1 and 4, the semiconductor memories 3 each have signal terminals for address, data and control, as well as a power supply terminal and a ground terminal. Also, although it is not shown in FIG. 5, the printed circuit board 2 has a plurality of connection terminals 41 formed at one edge thereof in the same manner as shown in FIG. 1.

Of the metal conductive layers of the printed circuit board 2, the power supply layers 22 are connected to the power supply terminals Vcc of the semiconductor memories 3 and the ground layer 23 is connected to the ground terminals Gnd of the semiconductor memories 3. Further, the power supply layers 22 are also connected to the power supply Vcc of the connection terminals 41 and the ground layer 23 is connected to the ground Gnd of the connection terminals 41. The signal layer 21 comprises a pair of first signal layers 21a, on which the semiconductor memories 3 are mounted and a plurality of connection terminals 41 are arranged, and a second signal layer 21b for electrically connecting the signal lines of the semiconductor memories 3 and the signal terminals of the connection terminals 41.

The uppermost first signal layer 21a and the second signal layer 21b are arranged adjacent to each other with the power supply layer 22 and the first insulating layer 241 interposed therebetween. The first insulating layer 241 represents an insulating layer interposed between the first or second signal layer 21a or 21b and the power supply layer 22 or ground layer 23 arranged closest to the first or second signal layer 21a or 21b.

Figure 5:
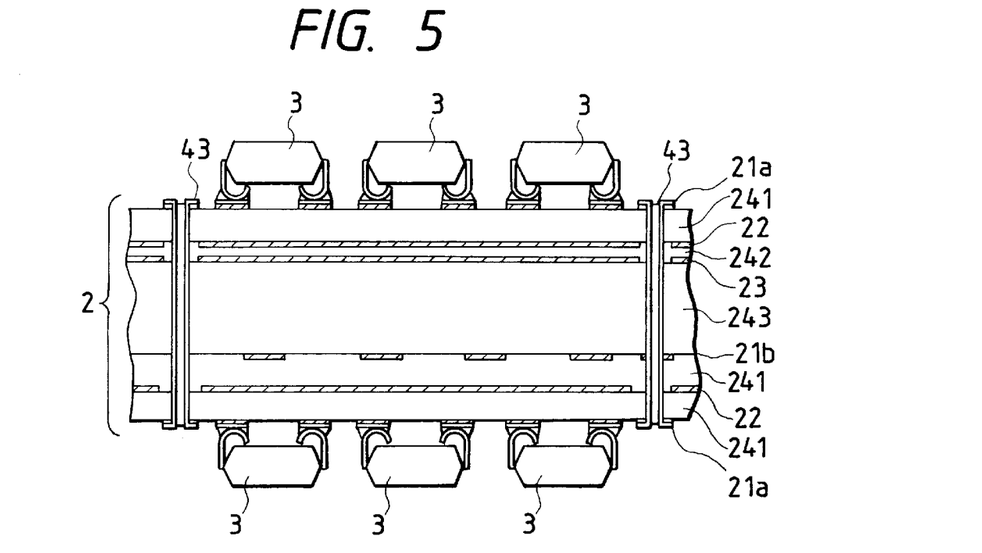
FIG. 5 is a partial cross section of a memory module of another embodiment of this invention.

As shown in FIG. 5, there are two power supply layers 22, which have at least the ground layer 23 and the second insulating layer 242 therebetween.

The third insulating layer 243 is provided between the second signal layer 21b and the ground layer 23 and is an insulating layer other than the first insulating layer 241 and the second insulating layer 242. That is, the third insulating layer 243, similarly to the first insulating layer 241, is located between the second signal layer 21b and the power supply layer 22 or ground layer 23, and represents an insulating layer which, when viewed from the second signal layer 21b, is provided between the second signal layer 21b and the power supply layer 22 or ground layer 23 second closest to the second signal layer 21b.

The thickness of the second insulating layer 242 is a half or a quarter of the thickness of the first insulating layer 241. The connection between the metal conductive layers is made through vies 43. Ordinarily, the semiconductor memory 3 has a structure of FIG. 4, in which the chip 31 and a part of the leads 32 electrically connected to the chip 31 are encapsulated with the sealing material 33.

The metal conductive layers are preferably made of copper foil, but can be made of other metals with low resistivity. The insulating layers 24 are suitably formed of an epoxy containing glass woven fabric, but may be made of a resin material such as polyamide which has high insulation properties and a capability of lamination.

The metal conductive layers are preferably 3 ~m to 100 ~m thick. Because the loss due to resistance becomes large as the thickness decreases, and because the pattern formation becomes difficult as the thickness increases, the most desirable thickness is in the range of 10–40 ~m.

The thickness of the insulation layer is determined considering the ease of manufacture, the mechanical strength, mechanical rigidity and electric insulation of the modules and the dielectric constant of interconnection, and therefore depends on the material used. The allowable range of thickness of the insulation layers is 3 $\mu$m to 1 mm.

Now, the operation of this embodiment will be explained. The semiconductor memory 3 has a function to store and reproduce digital data according to external signals supplied from the connection terminals 41. The semiconductor memory 3 has its Vcc terminal connected to the power supply and its terminals Gnd connect to the ground to supply current to the chin.

The terminals of each semiconductor memory 3 are connected through the signal interconnections, a power supply layer 22 and ground layer 23 to the connection terminals 41, which are further connected to signals of external circuits, such as the printed circuit boards of a computer, and to the power supplies.

The each semiconductor memory 3 connected to external circuits in this way performs storage and reproduction of digital data according to the control from the external circuits. Ordinarily, the signals include address, address strobe, data, read/write and output enable, and specify specific addresses for storage and reproduction of data.

During the storage or reproduction operation, a large current passes through the memory module 1 temporarily at the timing when voltages of a plurality of addresses and data simultaneously change from high to low levels or from low to high levels. Particularly, in a CMOS circuit, as shown in FIG. 7, when the output signal Vout switches upon the logic inversion of an input signal yin, both the P-MOS and the N-MOS become conductive instantaneously, allowing a short circuit current to flow from the power supply to the ground.

In the memory modules 1 of this embodiment, the short circuit current flows in from the Vcc of the connection terminals 41 through the via 43, a power supply layer 22 and via 43 and through the power supply terminal Vcc of the semiconductor memory 3 into the semiconductor memory 3. The current then flows out from the ground terminal Gnd of the semiconductor memory 3 through the via 43, ground layer 23 and via 43 to the Gnd of the connection terminals 41.

The signal layer 21 is close to the power supply layer 22 or ground layer 23 with the first insulating layer 241 interposed therebetween, so that once the width of interconnection allowed in the process is determined, a desired characteristic impedance can be obtained by determining the dielectric constant and thickness of the first insulating layer 241. Hence, by matching the characteristic impedance of the interconnects with the characteristic impedance of an external circuit connected to the connection terminals 41, it is possible to reduce reflection noise that may cause erroneous operation during signal transmission.

At least one set of a power supply layer 22 and ground layer 23 is arranged close to each other with the second insulating layer 242 interposed between, and the thickness of the second insulating layer 242 is ½ to ¼ the thickness of the first insulating layer 241, so that when a short circuit current flows, the magnetic coupling between the power supply layer 22 and the ground layer 23 becomes strong. As a result, the mutual inductance between the power supply layer 22 and the ground layer 23 becomes large, which, in turn, makes it possible to reduce effective inductance between the power supply layer 22 and the ground layer 23.

The thickness of the insulating layers must be determined based on the minimum thickness that can be handled in the manufacture process and on the dielectric breakdown voltage. The insulating layers are most easily manufactured where the thicknesses are integral multiples of a certain thickness.

As described above, because the effective inductance of this embodiment between the power supply layer 22 and the ground layer 23 can be reduced without complicating the manufacture process, it is possible to reduce noise caused by the short circuit current. The reduced noise, in turn, allows the memory module 1 to have a higher processing speed.

Although the memory module 1 of this embodiment has the semiconductor memories 3 mounted on both sides of the printed circuit board 2, the same effect can be obtained when the semiconductor memories 3 are mounted on only one side of the printed circuit board 2.

Further, while in this embodiment an SOJ (small outline J leaded package) is used for the semiconductor memory 3, it is also possible to use semiconductor memories packaged in QFP (quad flat package), PGA (pin grid array package) or TCP (tape carrier package).

Further, although the embodiment having six metal conductive layers has been described, the only necessary condition is that the power supply layer and the ground layer be arranged next to each other with the second insulating layer interposed between. Any other number of layers may be possible.

Because the effective inductance between the power supply layer and the ground layer of this embodiment can be lowered without complicating the manufacturing process, it is possible to reduce noise caused by the short circuit current. With the noise reduced, the memory module 1 has an increased processing speed.

Figure 6:
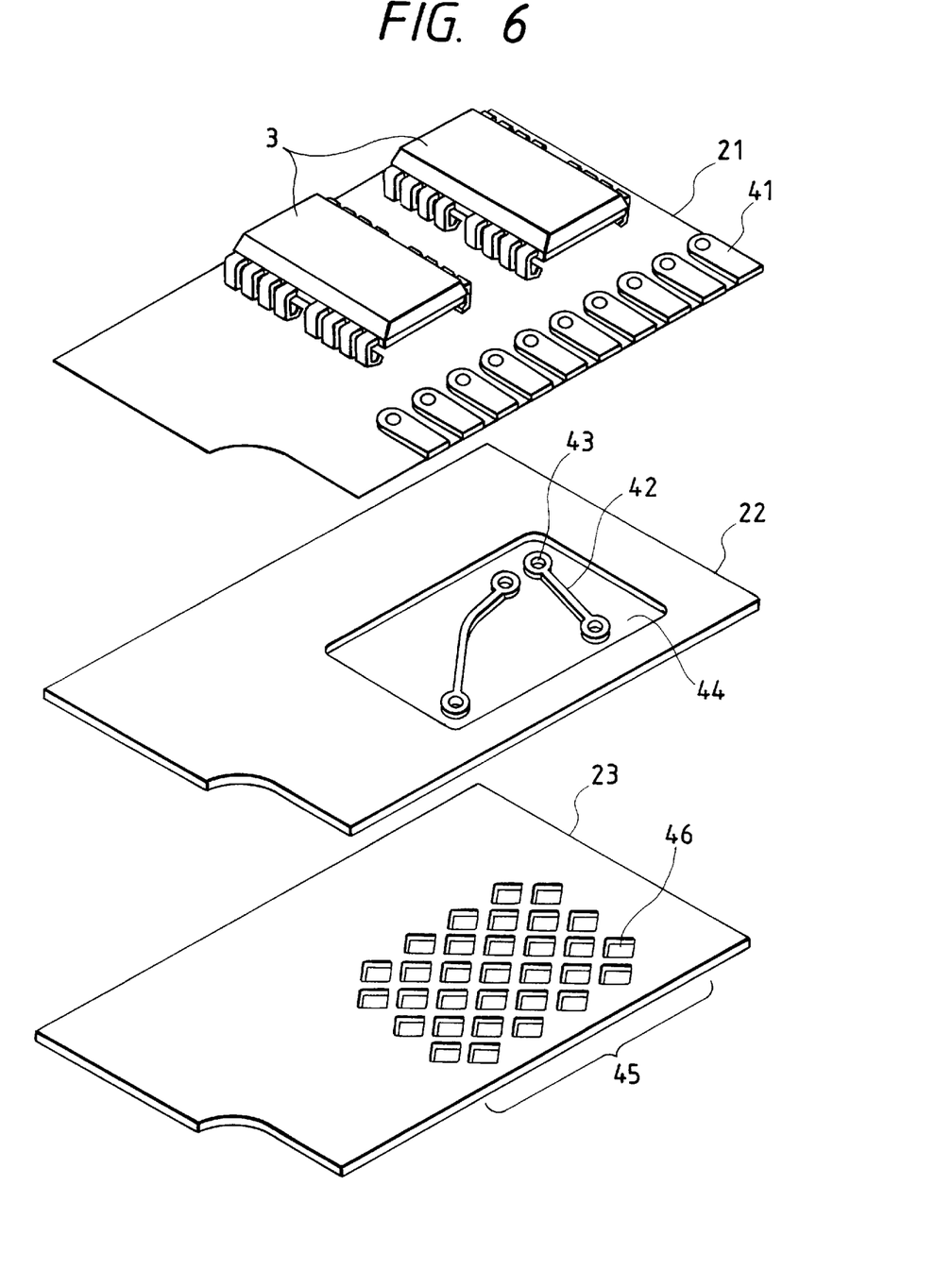
FIG. 6 is a partial exploded perspective view of the memory module of the second embodiment.

Next, another embodiment of the memory module 1 of this invention will he described referring to FIGS. 6 and 2.

The overall configuration of this embodiment is similar to that shown in FIG. 2. That is, the memory module 1 comprises a multilayer printed circuit board 2, which has a plurality of metal conductive layers and a plurality of insulating layers interposed between the metal conductive layers; a plurality of semiconductor memories 3 mounted on the printed circuit board 2; and connection terminals 41 formed at one edge of the printed circuit board 2 for electrical connection with external circuits.

The constitutional elements featuring this embodiment will be explained with reference to FIG. 6. FIG. 6 shows only three layers of the metal conductive layers for the semiconductor memory 3, that is, the top signal layer 21, the power supply layer 22 and the ground layer 23. For the sake of simplicity, in FIG. 6 the insulating layers between the metal conductive layers are not shown, and also the signal lines on the signal layer 21 and most of the lands and vies used to connect the semiconductor memories are not shown.

On the top signal layer 21 there are provided a plurality of connection terminals 41. The semiconductor memories 3 are mounted on this signal layer 21. The power supply layer 22 is made of a sheet metal conductor for the most part and, at one part, has a wiring area 44 where the metal conductor is removed and interconnections 42 and vies 43 are formed.

The ground layer 23 has a meshed area 45 in a part of the sheet metal conductor. The meshed area 45 is an area of the sheet metal conductor that has a number of small holes 46 formed therein at predetermined positions. The meshed area 45 is located at a position facing the wiring area 44 of the power supply layer 22. Though not shown, the semiconductor memory 3 has a power supply terminal and a ground terminal, connected to the power supply layer 22 and the ground layer 23, respectively.

The signal terminals of the semiconductor memory 3 for address, data and control are connected, as required, to the connection terminals 41 through the signal layer 21 and through the interconnection 42 and vies 43 in the wiring area 44 of the power supply layer 22.

The metal conductive layers are ordinarily made of copper foil but may be made of other metals, preferably with low resistivity. The insulating layers 24 are preferably made of epoxy containing glass woven fabric, but may also be made of a resin material such as polyamide which has a high insulating properties and a capability of lamination.

The metal conductive layers are preferably 3–100 ~m thick. Because the resistance loss increases as the thickness decreases and because the pattern generation becomes difficult as the thickness increases, it is particularly preferable to determine the thickness in the range of 10–40 $\mu$m.

The thickness of the insulation layers are determined considering the ease of manufacture, the mechanical strength, mechanical rigidity and electric insulation properties of the module and the dielectric constant of interconnection, and therefore depends on the materials used. The thickness of the insulation layers is preferably in the range of 3 $\mu$m to 1 mm.

Now, the operation of this embodiment will be explained. The semiconductor memory 3 has a function to store and reproduce digital data according to external signals supplied from the connection terminals 41. The Vcc terminal of the semiconductor memory 3 is connected to the power supply and the Gnd terminal of the memory 3 is connected to the ground to supply current to the chip.

The terminals of the semiconductor memory 3 are connected through signal interconnects, power supply layer 22 and ground layer 23 to the connection terminals 41, which are further connected to signals of external circuits, such as computer printed circuit boards, and to power supplies.

Each semiconductor memory 3 connected to external circuits in this way performs storage and reproduction of digital data according to the control from the external circuits. Ordinarily, the signals include address, address strobe, data, read/write and output enable, and specify specific addresses for storage and reproduction of data.

The signal layer 21 is used to provide mainly interconnection. When the quantity of interconnection is large, it cannot be accommodated in this layer alone. In that case, the wiring area 44 is provided in the power supply layer 22 to accommodate a part of these interconnections to accomplish the necessary wiring without increasing the number of metal conductive layers.

When part of interconnection is accommodated in the power supply layer 22, and when the ground layer 23 is close to the interconnection, the electrostatic capacitance between the interconnection 42 and the ground layer 23 becomes large, making it difficult to maintain the characteristic impedance at a desired value.

In this embodiment, the meshed area 45 is provided in the ground layer at an area facing the wiring area 44 of the power supply layer 22. By changing the sizes and positions of the holes 46 in the meshed area 45, the electrostatic capacitance can be adjusted, allowing the characteristic impedance of the interconnection 42 to be adjusted to a desired value without changing the manufacturing process. The sizes of the holes 46 preferably correspond to the width of the interconnection. Because the width of the interconnection is mostly 0.05 mm to 0.4 mm, the sizes of the holes 46 are preferably in the range of 0.05 mm to 0.8 mm.

Because the characteristic impedance of the interconnection 42 in the wiring area 44 provided in a part of the power supply layer 22 can be adjusted to a desired value even when the distance between the ground layer 23 and the power supply layer 22 changes, it is possible to realize interconnection of good transmission quality with a reduced number of metal conductive layers and also to reduce the power supply and ground inductance by arranging the power supply layer 22 and the ground layer 23 close to each other without impairing the transmission characteristic of the interconnection.

The noise due to short circuit current and the transmission noise can therefore be reduced, which in turn increases the processing speed of the memory module 1.

Although this embodiment has the wiring area 44 in the power supply layer 22 and the meshed area 45 in the ground layer 23, it is possible to provide the wiring area 44 in the ground layer 23 and the meshed area 45 in the power supply layer 22 and still produce substantially the same effect. Although in this embodiment an SOJ package is used for the semiconductor memory 3, semiconductor memories packaged in the QFP, PGA and TCP packages may also be used.

With this embodiment, the effective inductance between the power supply layer and the ground layer can be reduced without complicating the manufacturing process, and the characteristic impedance of the signal lines can be adjusted. This reduces the noise caused by the short circuit current and the transmission noise, making it possible to provide a memory module with increased processing speeds.

Figure 9:
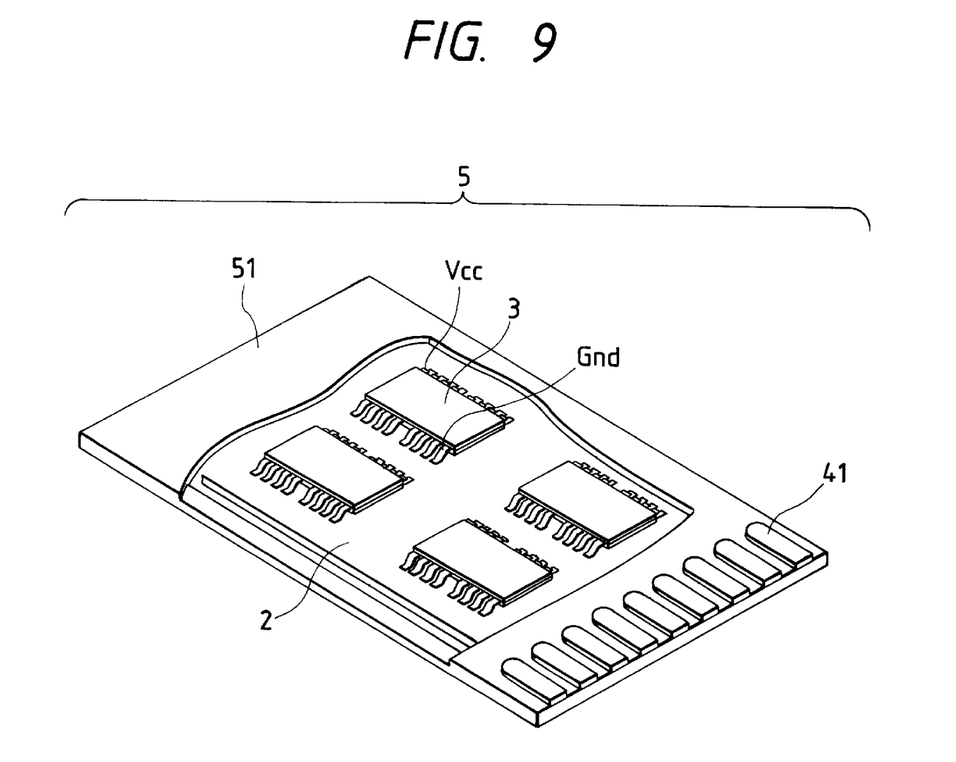
FIG. 9 is a perspective view of an IC card of a further another embodiment of this invention.

Next, one embodiment of an IC card according to this invention will be explained referring to FIG. 9.

The IC card 5 of this embodiment, like the memory module 1 of FIG. 1, comprises a multilayer printed circuit board 2 having a plurality of metal conductive layers and a plurality of insulating layers interposed between the metal conductive layers; a plurality of semiconductor memories 3 mounted on and electrically connected to the printed circuit board 2; and connection terminals 41 formed at one edge of the printed circuit board 2 and connected with the semiconductor memories 3.

In this embodiment, the semiconductor memories 3 are mounted on only one side of the printed circuit board 2. The printed circuit board 2 mounted with the semiconductor memories 3 is accommodated in a card case 51, thus forming an IC card 5.

Although in this embodiment only the semiconductor memories 3 are mounted on the printed circuit board 2, a semiconductor device that performs control for communication and encryption may also be mounted. The configurations of the semiconductor memories 3 and the printed circuit board 2 are similar to those of the previous embodiments, and, therefore their explanations will be omitted. In FIG. 9, the semiconductor memory 3 is packaged in a TSOP (thin small outline package) of a thin semiconductor package type.

The IC card 5 is carried by humans, connected to a computer as required and, therefore must have a sufficient mechanical strength to prevent breakage during transport or during operation. It is also required to have protective measures against the external environment for preventing corrosion or short-circuiting due to moisture. The card case 51, therefore, is preferably made of resin such as epoxy and acrylic.

The operation of this embodiment is similar to that of the previous embodiment and its explanation is not given here. This embodiment has a reduced ground inductance and power supply inductance, making it possible to reduce noise and to provide an IC card with faster processing speeds.

Although the advantages of the present invention have been described taking the cases of the memory module and the IC card, similar effects and advantages can be obtained as long as the semiconductor module has the connection terminals arranged at one edge of the multilayer printed circuit board.

According to this invention, the noise of a semiconductor module, such as a memory module and an IC card, can be reduced, allowing faster processing speed, which, in turn, improves the characteristic of the semiconductor module without increasing the cost of manufacture. In addition, it enhances the reliability of an electronic apparatus connected to the semiconductor module.

What is claimed is:

1. A semiconductor module comprising:
   a multilayer printed circuit board having a plurality of metal conductive layers and a plurality of insulating layers interposed between the metal conductive layers;
   a plurality of semiconductor devices mounted on at least one side of the multilayer printed circuit board and electrically connected to the multilayer printed circuit board; and
   a plurality of connection terminals arranged at one edge of the at least one side of the multilayer printed circuit board to electrically connect the printed circuit board to external circuits;
   wherein the plurality of metal conductive layers include a signal layer having the plurality of semiconductor devices mounted thereon and the plurality of connection terminals formed thereon, a power supply layer for electrically connecting a power supply terminal of each of the semiconductor devices with a power supply terminal of the connection terminals, and a ground layer for electrically connecting a ground terminal of each of the semiconductor devices with a ground terminal of the connection terminals;
   wherein when the power supply terminal of each of the semiconductor devices is located farther from the connection terminals than the ground terminal, the power supply layer is arranged closer to the semiconductor devices than the ground layer, and when the ground terminal of each of the semiconductor devices is located farther from the connection terminals than the power supply terminal, the ground layer is arranged closer to the semiconductor devices than the power supply layer.

2. A semiconductor module according to claim 1, wherein, of the plurality of insulating layers, a second insulating layer interposed between the power supply layer and the ground layer has a thickness which is ¼ to ½ the thickness of a first insulating layer interposed between the signal layer and the power supply layer or the ground layer.

3. A memory module comprising:
   a multilayer printed circuit board having a plurality of metal conductive layers and a plurality of insulating layers interposed between the metal conductive layers;
   a plurality of semiconductor memories mounted on at least one side of the multilayer printed circuit board and electrically connected to the multilayer printed circuit board; and
   a plurality of connection terminals arranged at one edge of the at lest one side of the multilayer printed circuit board to electrically connect the printed circuit board to external circuits;
   wherein the plurality of metal conductive layers include a signal layer having the plurality of semiconductor memories mounted thereon, a power supply layer for electrically connecting a power supply terminal of each of the semiconductor memories with a power supply terminal of the connection terminals, and a ground layer for electrically connecting a ground terminal of each of the semiconductor memories a ground terminal of the connection terminals;
   wherein when the power supply terminal of each of the semiconductor memories is located farther from the connection terminals than the ground terminal, the power supply layer is arranged closer to the semiconductor memories than the ground layer, and when the ground terminal of each of the semiconductor memories is located farther from the connection terminals than the power supply terminal, the ground layer is arranged closer to the semiconductor memories than the power supply layer.

4. A memory module according to claim 3, wherein, of the plurality of insulating layers, a second insulating layer interposed between the power supply layer and the ground layer has a thickness which is ¼ to ½ the thickness of a first insulating layer interposed between the signal layer and the power supply layer or the ground layer.

5. A memory module comprising:
   a multilayer printed circuit board having a plurality of metal conductive layers and a plurality of insulating layers interposed between the metal conductive layers;
   a plurality of semiconductor memories mounted on at least one side of the multilayer printed circuit board and electrically connected to the multilayer printed circuit board; and
   a plurality of connection terminals arranged at one edge of at least one side of the multilayer printed circuit board to electrically connect the printed circuit board to external circuits;
   wherein the plurality of metal conductive layers include at least one first signal layer having the plurality of semiconductor memories mounted thereon and the plurality of connection terminals formed thereon, at least one power supply layer for electrically connecting a power supply terminal of each of the semiconductor memories with a power supply terminal of the connection terminals, at least one ground layer for electrically connecting a ground terminal of the connection terminals, and at least one second signal layer for electrically connecting sign terminals of each of the semiconductor memories with signal terminals of the connection terminals;

wherein a first insulating layer is interposed between the first signal layer and the power supply layer or the ground layer, a second insulating layer is arranged adjacent to the power supply layer or the ground layer and interposed between the power supply layer and the ground layer, and the thickness of the second insulating layer is ¼ to ½ the thickness of the first insulating layer.

6. An IC card comprising:

a multilayer printed circuit board having a plurality of metal conductive layers and a plurality of insulating layers interposed between the metal conductive layers;

a plurality of semiconductor memories mounted on at least one side of the multilayer printed circuit board and electrically connected to the multilayer printed circuit board; and a plurality of connection terminals arranged at one edge of at least one side of the multilayer printed circuit board to electrically connect the printed circuit board to external circuits;

wherein the plurality of metal conductive layers include a signal layer having the plurality of semiconductor memories mounted thereon and the plurality of connection terminals formed thereon, a power supply layer for electrically connecting a power supply terminal of each of the semiconductor memories with a power supply terminal of the connection terminals, and a ground layer for electrically connecting a ground terminal of each of the semiconductor memories with a ground terminal of the connection terminals;

wherein when the power supply terminal of each of the semiconductor memories is located farther from the connection terminals than the ground terminal, the power supply layer is arranged closer to the semiconductor memories than the ground layer, and when the ground terminal of each of the semiconductor memories is located farther from the connection terminals than the power supply terminal, the ground layer is arranged closer to the semiconductor memories than the power supply layer.

7. An IC card according to claim. 6, wherein, of the plurality of insulating layers, a second insulating layer interposed between the power supply layer and the ground layer has a thickness which is ¼ to ½ the thickness of a first insulating layer interposed between the signal layer and the power supply layer or the ground layer.

8. A memory module according to claims 3 or 5, wherein the semiconductor memories are arranged facedown.

9. A memory module according to claims 3 or 5, wherein the ground layer or the power supply layer has a signal wiring area in a predetermined portion thereof, and holes of a predetermined sizes are provided in a predetermined portion of the power supply layer or the ground layer that faces the signal wiring area.

10. An IC card according to claim 6, wherein the semiconductor memories are arranged facedown.

* * * * *